United States Patent
Shiomi et al.

(10) Patent No.: US 6,921,970 B2
(45) Date of Patent: Jul. 26, 2005

(54) PACKAGE FOR ELECTRONIC PARTS, LID THEREOF, MATERIAL FOR THE LID AND METHOD FOR PRODUCING THE LID MATERIAL

(75) Inventors: Kazuhiro Shiomi, Ibaraki (JP); Masaaki Ishio, Osaka (JP)

(73) Assignees: Neomax Materials Co., Ltd., Osaka (JP); Daishinku Corporation, Kakogawa (JP)

( * ) Notice: Subject to any disclaimer, the term of this patent is extended or adjusted under 35 U.S.C. 154(b) by 0 days.

(21) Appl. No.: 10/490,484

(22) PCT Filed: Nov. 8, 2002

(86) PCT No.: PCT/JP02/11704

§ 371 (c)(1),
(2), (4) Date: Mar. 23, 2004

(87) PCT Pub. No.: WO03/043082

PCT Pub. Date: May 22, 2003

(65) Prior Publication Data

US 2004/0207071 A1 Oct. 21, 2004

(30) Foreign Application Priority Data

Nov. 12, 2001 (JP) ........................................ 2001-346365

(51) Int. Cl.[7] .............................................. H01L 21/44
(52) U.S. Cl. ...................... 257/704; 257/703; 257/712; 257/711; 257/720; 257/741; 257/747; 257/706; 257/675; 257/765; 257/743; 257/744
(58) Field of Search ................................. 257/703, 704, 257/711, 712, 720, 741, 747, 706, 675, 765, 743, 744, 700, 701, 702, 678, 684

(56) References Cited

U.S. PATENT DOCUMENTS 5,814,880 A * 9/1998 Costello et al. ............. 257/678

FOREIGN PATENT DOCUMENTS

| EP | 0 989 605 A2 | 3/2000 | |
|---|---|---|---|
| EP | 0989605 | * 3/2000 | |
| JP | 03-283549 | 12/1991 | |
| JP | 2000-003973 | 1/2000 | |
| JP | 2000-150687 | 5/2000 | |
| JP | 2000-150689 | 5/2000 | |
| JP | 2000-164746 | 6/2000 | |
| JP | 2000-211055 | * 8/2000 | ......... H01L/23/373 |

* cited by examiner

Primary Examiner—Nathan J. Flynn
Assistant Examiner—Fazli Erdem
(74) Attorney, Agent, or Firm—Keating & Bennett, LLP

(57) ABSTRACT

A lid material (1) according to the present invention comprises: a base layer (2) composed of a low thermal expansion metal; an intermediate metal layer (3) provided on one surface of the base layer (2) and composed of a low proof stress metal having a proof stress of not greater than 110 $N/mm^2$; and a brazing material layer (4) provided on the intermediate metal layer (3) and composed of a silver brazing alloy mainly comprising silver. The intermediate metal layer (3) and the brazing material layer (4) are press- and diffusion-bonded to each other, and the brazing material layer (4) has a blistered area ratio of not greater than 0.5% as observed on an outer surface of the brazing material layer. The low proof stress metal is preferably oxygen-free copper. A lid produced from the lid material (1) exhibits an excellent bonding property when the lid is brazed to a case mainly composed of a ceramic material for an electronic component package. Further, the lid suppresses the breakage of the case, and ensures excellent brazing workability.

18 Claims, 1 Drawing Sheet

PACKAGE FOR ELECTRONIC PARTS, LID THEREOF, MATERIAL FOR THE LID AND METHOD FOR PRODUCING THE LID MATERIAL

BACKGROUND OF THE INVENTION

1. Field of the Invention

The present invention relates to an electronic component package having a case for housing an electronic component and a lid sealing an opening of the case, to a lid for the package, and a lid material for the lid.

2. Description of the Related Art

Packages for housing various electronic components such as semiconductor devices and piezoelectric vibrators comprise a case having an opening through which an electronic component housing cavity defined therein opens in an upper surface thereof, and a lid brazed to a portion of the case around the opening to close the opening of the case for sealing the cavity, as disclosed in Japanese Unexamined Patent Publication No. 2000-3973 (Patent Document 1).

The case is mainly composed of a ceramic material such as alumina or aluminum nitride. On the other hand, the lid comprises a base layer composed of a low thermal expansion metal such as a Fe—29% Ni—17% Co alloy (trade name: KOVAR), and a brazing material layer of a metal brazing material provided on one surface of the base layer. A silver brazing alloy mainly comprising silver is typically used as the metal brazing material.

As disclosed in Patent Document 1, seam welding is often employed as a method for brazing the lid to the portion of the case around the opening. The brazing can efficiently be achieved by the seam welding without the need for a vacuum environment with the use of a relatively simple facility. Another method for the brazing is electron beam welding, wherein an electron beam is applied to an outer peripheral portion of the back surface (outer surface) of the lid stacked on the case to fuse the brazing material layer.

Japanese Unexamined Patent Publication No. HEI3 (1991)-283549 (Patent Document 2) discloses an electronic component package, as a related art, which includes a copper foil provided between an aluminum nitride substrate and a cap or a cap fixture composed of a low thermal expansion metal such as KOVAR, the copper foil being brazed to the substrate and to the cap or the like.

Further, Japanese Unexamined Patent Publication No. 2000-164746 (Patent Document 3) discloses a lid material for a lid of an electronic component package, the lid material including a soldering material layer press-bonded to a Ni-based metal layer diffusion-bonded to a base layer, the Ni-based metal layer having a predetermined maximum-to-minimum thickness ratio.

With the height reduction and size reduction of the electronic components in recent years, it has been desired to further reduce the height and size of the packages for the electronic components. Therefore, the thickness of the lid is reduced. Further, the size of the case per se is reduced, and the thickness of walls defining the electronic component housing cavity in the ceramic case is correspondingly reduced.

In view of this, where the lid is brazed to the case with the use of the silver brazing alloy, since the silver brazing alloy has a relatively high melting point of about 780° C., in the case of the art of Patent Document 1, a great thermal stress occurs in the walls of the case during the cooling of the brazing material due to a difference in thermal expansion coefficient between the ceramic material constituting the case and the low thermal expansion metal constituting the base layer of the lid. The thermal stress causes cracks in the walls, resulting in the problem of reduced hermeticity. This problem is associated with not only the seam welding but also the electron beam welding.

The art disclosed in Patent Document 2 employs the copper foil as a material for accommodating the deformation of the cap or the cap fixture, and states that the copper foil preferably has a thickness of 0.1 to 2.0 mm. The copper foil may be effective for prevention of the breakage of the planar substrate, because the copper foil per se thermally deforms to a greater extent in thicker regions thereof. However, a sufficient effect cannot be provided for prevention of the breakage of the thin walls of the case having a reduced size. It is also stated that the copper foil is brazed to the substrate and to the cap or the like. This results in very poor brazing workability, thereby leading to lower package productivity.

In the art disclosed in Patent Document 3, on the other hand, the Ni-based metal layer and the soldering material layer stacked on the Ni-based metal layer are merely press-bonded to each other, but not diffusion-bonded to each other. Therefore, where a brazing material such as a silver brazing alloy having an inferior cold press-bonding property is employed instead of the soldering material, a bonding strength between the Ni-based metal layer and the brazing material layer is problematic. The layers may be diffusion-annealed after the press-bonding thereof, but the problem of voids occurring during the diffusion-annealing is not disclosed nor suggested at all.

In view of the problems described above, it is an object of the present invention to provide a lid for an electronic component package which, when being brazed to a case of the electronic component package, alleviates a thermal stress occurring in the case thereby to reduce the possibility of the breakage of the case and ensures excellent brazing workability, and to provide a lid material for the lid and a production method for the lid material. It is another object of the present invention to provide an electronic component package sealed by the lid with excellent hermeticity.

SUMMARY OF THE INVENTION

A lid material according to the present invention is a material for a lid to be fuse-bonded to a portion of a case around an opening through which an electronic component housing space defined in the case opens in a surface of the case, and comprises a base layer composed of a low thermal expansion metal, an intermediate metal layer provided on one surface of the base layer and composed of a low proof stress metal having a proof stress of not greater than 110 $N/mm^2$, preferably not greater than 100 $N/mm^2$, and a brazing material layer provided on the intermediate metal layer and composed of a silver brazing alloy mainly comprising silver. The intermediate metal layer and the brazing material layer are press- and diffusion-bonded to each other, and the brazing material layer has a blistered area ratio of not greater than 0.5% as observed on an outer surface of the brazing material layer. In the present invention, the term "proof stress" means a stress observed when a permanent elongation of 0.2% occurs.

Since the brazing material layer is press- and diffusion-bonded to the intermediate metal layer provided on the base layer of the lid material, there is no need to separately prepare a brazing material for the brazing. Therefore, the lid material ensures excellent brazing workability. The intermediate metal layer can easily be formed in a smaller thickness simply by adjusting a rolling reduction ratio in the press bonding.

The intermediate metal layer is composed of the low proof stress metal having a proof stress of not greater than 110 N/mm². Therefore, the intermediate metal layer is easily plastically deformed, even if the base layer is deformed to the case due to a difference in thermal expansion coefficient between the case and the base layer when a lid produced from the lid material is brazed to the portion of the case around the opening. Accordingly, a thermal stress occurring in the case due to the deformation of the base layer can be suppressed, whereby the breakage of walls of the case can be prevented.

Although the brazing material layer is press- and diffusion-bonded to the intermediate metal layer, virtually no void is present therebetween. Therefore, the lid is locally heated (a peripheral portion of the lid is heated) for a very short period by the seam welding or the electron beam welding for the brazing of the lid, whereby Joule heat generated in the base layer or heat applied to the base layer can quickly be conducted to the brazing material layer through the intermediate metal layer. Thus, the brazing material layer can assuredly be fused to exhibit an excellent braze-bonding property. This effect is further enhanced where the intermediate metal layer is formed in a smaller thickness.

Since virtually no void is present between the intermediate metal layer and the brazing material layer as described above, the lid material is excellent in stampability. Even a small-size lid can easily be produced with a high level of dimensional accuracy by stamping the lid material. Therefore, the lid material ensures excellent productivity.

In the lid material, the low proof stress metal is preferably a pure copper having a copper content of not smaller than 99.9 mass %. Particularly, an oxygen-free copper having an oxygen content of not greater than 0.05 mass % is preferred. The pure copper is excellent in heat conductivity, and has a low proof stress and hence has a high plastic deformability. With an increased impurity content, the pure copper has a higher hardness, so that the effect of alleviating the thermal stress is reduced. Therefore, the impurity content is preferably reduced to not greater than 0.1 mass %. Where the pure copper has an increased oxygen content, the heat conductivity is reduced, and voids are more liable to occur when the intermediate metal layer and the brazing material layer are diffusion-annealed. Therefore, the oxygen content is preferably reduced to not greater than 0.05 mass %.

In the lid material, the intermediate metal layer preferably has a thickness of 10 to 200 μm (not smaller than 10 μm and not greater than 200 μm), more preferably not smaller than 10 μm and smaller than 100 μm. With a thickness of smaller than 10 μm, the intermediate metal layer cannot sufficiently plastically deform and, therefore, cannot easily follow the deformation of the base layer. Hence, the effect of alleviating the thermal stress occurring in the case is decreased. With a thickness of greater than 200 μm, on the other hand, the intermediate metal layer per se experiences non-ignorable thermal deformation, failing to alleviate the thermal stress occurring in the case.

The lid material may further comprise a nickel-based metal layer bonded to the other surface of the base layer and composed of a nickel-based metal consisting of pure nickel or a nickel alloy mainly comprising nickel, whereby the corrosion resistance of the outer surface of the base layer can be improved. Further, the lid material, a lid produced from the lid material, and an electronic component package sealed by the lid are prevented from being smeared or damaged. The nickel-based metal layer also has the effect of suppressing the warpage of the lid material occurring due to a difference in thermal expansion coefficient between the base layer and the intermediate metal layer.

A lid material production method according to the present invention is a method of producing a lid material for a lid which is to be fuse-bonded to a portion of a case around an opening through which an electronic component housing space defined in the case opens in a surface of the case, and comprises the steps of: preparing an intermediate metal layer laminate which comprises a base layer composed of a low thermal expansion metal and an intermediate metal layer provided on one surface of the base layer and composed of a low proof stress metal having a proof stress of not greater than 110 N/mm²; press-bonding a brazing material layer of a silver brazing alloy mainly comprising silver onto the intermediate metal layer of the intermediate metal layer laminate to provide a brazing material layer press-bonded body; and diffusion-annealing the brazing material layer press-bonded body for diffusion-bonding the brazing material layer to the intermediate metal layer to provide the lid material. In the press-bonding step, a rolling reduction ratio for the press-bonding is 50% to 80% (not smaller than 50% and not greater than 80%). In the annealing step, an annealing temperature is 380° C. to 590° C. (not lower than 380° C. and not higher than 590° C). In the production method, the occurrence of voids between the intermediate metal layer and the brazing material layer can be suppressed to a virtually negligible level.

In the production method, the low proof stress metal constituting the intermediate metal layer is preferably a pure copper having a copper content of not smaller than 99.9 mass %. Particularly, an oxygen-free copper having an oxygen content of not greater than 0.05 mass % is preferred. The intermediate metal layer of the brazing material layer press-bonded body preferably has an average thickness of 10 to 200 μm, more preferably not smaller than 10 μm and smaller than 100 μm. The intermediate metal layer laminate preferably further comprises a nickel-based metal layer provided on the other surface of the base layer and composed of a nickel-based metal consisting of pure nickel or a nickel alloy mainly comprising nickel.

An electronic component package according to the present invention comprises: a case having an opening through which an electronic component housing space defined therein opens in a surface thereof; and a lid fuse-bonded to a portion of the case around the opening to cover the opening. The lid is produced, for example, by stamping the aforesaid lid material.

According to the electronic component package, the intermediate metal layer facilitates the quick fusion of the brazing material layer and suppresses a thermal stress occurring in the case when the lid is brazed to the case. Therefore, it is possible to prevent the breakage of the case and a bonding failure, thereby ensuring excellent hermeticity. Further, there is no need to separately prepare a brazing material for the brazing of the lid to the case, ensuring excellent brazing workability and productivity.

As described above, the inventive lid material includes the intermediate metal layer and the brazing material layer integrally bonded to each other with the intervention of virtually no void therebetween. Therefore, excellent brazing workability can be ensured without the need for separately preparing a brazing material for the brazing. Where the lid produced from the lid material is brazed to the case of the electronic component package by local heating by way of the seam welding or the electron beam welding, it is possible to prevent a bonding failure which may otherwise occur due to insufficient heat conduction attributable to voids, and to ensure an excellent braze-bonding property. Further, even if the lid is thermally deformed in the brazing, the intermediate metal layer can suppress the thermal stress occurring in the walls of the case, thereby suppressing the breakage of the walls due to the thermal stress. Therefore, the electronic component package can be provided which is excellent in hermeticity. Further, the inventive lid material production method ensures easy production of the lid material.

DETAILED DESCRIPTION OF PREFERRED EMBODIMENTS

Figure 1:
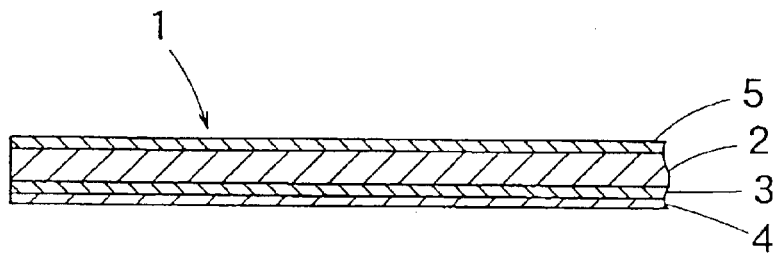
FIG. 1 is a schematic partial sectional view illustrating the basic construction of a lid material according to an embodiment of the present invention.

The basic construction of a lid material according to an embodiment of the present invention will first be described with reference to FIG. 1. The lid material 1 includes a base layer 2, a nickel-based metal layer 5 press- and diffusion-bonded to one surface (an upper surface in FIG. 1) of the base layer, an intermediate metal layer 3 press- and diffusion-bonded to the other surface (a lower surface in FIG. 1) of the base layer, and a brazing material layer 4 press- and diffusion-bonded to a surface of the intermediate metal layer 3.

The base layer 2 is composed of a low thermal expansion metal which has a proof stress of not smaller than the proof stress (200 N/mm$^2$) of pure iron (pure Fe) and has a smaller thermal expansion coefficient than iron. The low thermal expansion metal preferably has a thermal expansion coefficient of 4.0×10$^{-6}$/° C. to 5.5×10$^{-6}$/° C. at 30° C. to 300° C. Preferred examples of the low thermal expansion metal include Fe—Ni alloys comprising 36 to 50 mass % of nickel (Ni) such as a Fe—42 mass % Ni alloy, and Fe—Ni—Co alloys comprising 20 to 30 mass % of Ni and 1 to 20 mass % of cobalt (Co) such as KOVAR (trade name).

The nickel-based metal layer 5 serves to improve the corrosion resistance of the outer surface of the lid material 1, and is composed of a nickel-based metal such as pure nickel or a nickel alloy comprising Ni as a major component thereof, e.g., a Cu—Ni alloy comprising not smaller than 50 wt % of Ni. The nickel-based metal is excellent in press-bonding property and diffusion-bonding property to the base layer 2. The nickel-based metal layer 3 is not necessarily required, but may optionally be provided.

The intermediate metal layer 3 is composed of a low proof stress metal having a proof stress of not greater than 110 N/mm$^2$. Copper-based alloys, such as Cu—Ni alloys, comprising copper (Cu) as a major component thereof with a Cu content of not smaller than 90 mass %, preferably not smaller than 95 mass % are preferred as examples of the low proof stress metal. A pure copper having a Cu content of not smaller than 99.9 mass % is more preferred. If the Cu content is smaller than 99.9%, the hardness of the copper is generally increased though depending on the type of impurities. This makes it difficult for the intermediate metal layer to plastically deform to follow the deformation of the base layer 2 which may occur during a cooling process after the brazing material layer 4 is fused. Further, the pure copper is desirably an oxygen-free copper having an oxygen content of not greater than 0.05 mass %, preferably not greater than 0.01 mass %. With a smaller oxygen content, the copper has a lower hardness and, hence, has an enhanced thermal stress alleviating effect. As the oxygen content is reduced, the amount of voids occurring due to oxygen can be reduced when the brazing material layer is press- and diffusion-bonded to the intermediate metal layer. Further, the oxygen-free copper having an oxygen content of not greater than 0.05 mass % is available at a lower cost. For this reason, the oxygen-free copper having an oxygen content of not greater than 0.05 mass % is most preferable as the pure copper. The low proof stress metal is not limited to the copper-based metal described above, but may be pure Ni or a nickel-based alloy comprising not smaller than 90 mass % of Ni.

The easiness of the plastic deformation of the intermediate metal layer 3 depends on the proof stress of the low proof stress metal constituting the intermediate metal layer. As the Cu content is increased, the proof stress is reduced and the easiness of the plastic deformation is increased as described above. For example, the pure copper has a proof stress of 69 N/mm$^2$, and a 90 mass % Cu—Ni alloy has a proof stress of 103 N/mm$^2$. The pure nickel has a proof stress of 59 N/mm$^2$. On the other hand, KOVAR has a proof stress of 345 N/mm$^2$, which is not smaller than three times the proof stress of the low proof stress metal. Thus, the proof stress of the low proof stress metal constituting the intermediate metal layer 3 is preferably not greater than one third the proof stress of the low thermal expansion metal constituting the base layer 2.

The brazing material layer 4 is composed of a silver brazing alloy comprising silver (Ag) as a main component thereof. The content of Ag as the main component is preferably 70 to 90 mass %. The silver brazing alloy preferably has a melting point of about 700 to about 900° C. Specific examples of the silver brazing alloy include Ag—Cu alloys such as an 85 mass % Ag—Cu alloy (silver brazing material having a melting point of 780° C.), and Ag—Cu—Zn alloys and Ag—Cu—Ni alloys having melting points within the aforesaid melting point range.

Since an electronic component package is typically soldered to a substrate at a temperature not higher than about 400° C., it is necessary that the brazing material layer once fuse-bonded is not softened nor deteriorated at that temperature. The silver brazing alloy having an Ag content of 70 to 90 mass % preferably satisfies the aforesaid temperature requirement and is excellent in strength and corrosion resistance.

On the other hand, the silver brazing alloy is liable to create voids in an interface between the intermediate metal layer and the brazing material layer when the intermediate metal layer and the brazing material layer are diffusion-bonded to each other, as will be described later. When a lid produced from the lid material 1 is brazed to a portion of a case around an opening with the use of the silver brazing alloy having a high melting point, a to-be-brazed portion of the lid should be heated at a high temperature. This leads to a problem that a thermal stress occurs in the case due to the thermal deformation of the base layer 2. This problem can be solved by providing the intermediate metal layer 3 between the base layer 2 and the brazing material layer 4.

The brazing material layer 4 has a blistered area ratio of not greater than 0.5% as observed on the outer surface of the brazing material layer. The blister is attributed to the voids occurring in the bonding interface between the intermediate metal layer 3 and the brazing material layer 4. The intermediate metal layer 3 has an excellent press-bonding property to the base layer 2 and an excellent diffusion-bonding property to the base layer 2 in the diffusion annealing. Therefore, the base layer 2 and the intermediate metal layer 3 can easily be diffusion-bonded to each other without occurrence of voids in the interface therebetween. Where the intermediate metal layer 3 is composed of the copper-based metal, on the other hand, voids are much more liable to occur in the bonding interface between the intermediate metal layer 3 and the brazing material layer 4 of the silver brazing alloy. A reason for this is as follows. An oxide film formed on the surface of the intermediate metal layer composed of the copper-based metal is cracked in the press bonding. In the diffusion annealing, the cracked oxide film emanates oxygen, and the silver brazing alloy emanates oxygen and hydrogen. These gases gather to create voids. The voids created in the interface between the intermediate metal layer and the brazing material layer cause a bonding failure due to a heat conduction failure. The blistered area ratio is an index of the amount of the voids. With a blistered area ratio of not greater than 0.5%, the amount of the voids is sufficiently small, so that the heat conduction failure and the bonding failure are virtually negligible. The blistered area ratio is preferably reduced to a minimum level, e.g., to not greater than 0.3%. If the amount of the voids is not greater than 0.5%, the lid material is excellent in stampability. Even small-size lids can easily be produced by stamping the lid material with a high level of dimensional accuracy on a mass-production basis.

The average thicknesses of the respective layers depend on the size of the opening of the case. The base layer 2 has an average thickness of 30 to 200 $\mu$m, preferably about 50 to about 100 $\mu$m. The intermediate metal layer 3 has an average thickness of 10 to 200 $\mu$m, preferably not smaller than 10 $\mu$m and smaller than 100 $\mu$m, more preferably 15 to 60 $\mu$m. With a thickness of smaller than 10 $\mu$m, the intermediate metal layer has an insufficient thermal stress alleviating effect. With a thickness of greater than 200 $\mu$m, on the other hand, the intermediate metal layer is too thick, so that the thermal deformation of the intermediate metal layer per se is not ignorable. Therefore, the intermediate metal layer has an inferior thermal stress alleviating effect. Further, the ratio tm/tb of the thickness tm of the intermediate metal layer 3 to the thickness tb of the base layer 2 is preferably about 0.25 to about 0.6 to impart the intermediate metal layer 3 with sufficient plastic deformability to the deformation of the base layer 2. The brazing material layer 4 preferably has a thickness of about 5 to about 50 $\mu$m, and the nickel-based metal layer 5 preferably has a thickness of about 3 to about 50 $\mu$m. From the viewpoint of the height reduction of the electronic component package, it is preferred that the lid material has a total thickness of 50 to 150 $\mu$m.

Next, an explanation will be given to a method of producing the lid material.

The lid material 1 is produced through the following process. A nickel-based metal sheet as a material for the nickel-based metal layer 5 is stacked on one surface of a base sheet as a material for the base layer 2, and a copper-based metal sheet as a material for the intermediate metal layer 3 is stacked on the other surface of the base sheet. Then, the resulting stack is passed between a pair of rolls so as to be press-bonded at a rolling reduction ratio of about 70 to about 80%. Thus, the respective sheets are rolled and press-bonded to each other, thereby providing an intermediate metal layer laminate which includes the base layer, and the nickel-based metal layer and the intermediate metal layer press-bonded to the opposite surfaces of the base layer. As required, the intermediate metal layer laminate may be subjected to an intermediate annealing process at a temperature of about 950 to about 1050° C. The intermediate annealing process makes it possible to diffusion-bond the respective adjacent layers with an improved bonding strength and to soften the respective layers. Where the nickel-based metal layer 5 is not formed in the lid material 1, the nickel-based metal sheet is not required. The step of preparing the intermediate metal layer laminate in the aforesaid manner is herein referred to as a preparation step.

In turn, a brazing material sheet as a material for the brazing material layer 4 is stacked on the surface of the intermediate metal layer of the intermediate metal layer laminate, and the resulting stack is passed again between the pair of rolls so as to be rolled. Thus, a brazing material layer press-bonded body is provided which includes the brazing material layer press-bonded to the surface of the intermediate metal layer. This step is referred to as a press-bonding step. The brazing material layer press-bonded body is subjected to a diffusion annealing process, thereby providing the lid material 1 in which the brazing material layer is diffusion-bonded to the intermediate metal layer without the intervention of voids between the intermediate metal layer and the brazing material layer. This step is referred to as a diffusion-bonding step. As required, the lid material 1 is further subjected to a finish rolling process for adjustment of the thickness of the lid material. The thickness of each of the layers after the finish rolling process is reduced to generally (1-R) times the original thickness, wherein R is a rolling reduction ratio for the rolling.

It is important to bond the intermediate metal layer and the brazing material layer without creation of voids therebetween in the press-bonding step and the diffusion-annealing step. The inventors of the present invention investigated production conditions which allow for suppression of the occurrence of the voids. As a result, the inventors found that, where the intermediate metal layer is formed of the copper-based metal which is more liable to create the voids, it is preferred to employ a rolling reduction ratio of 50 to 80% for providing the brazing material layer press-bonded body and a diffusion-annealing temperature of 380 to 590° C. If the rolling reduction ratio is smaller than 50% and the annealing temperature is lower than 380° C., the bonding is insufficient with a reduced bonding strength in the press bonding and diffusion annealing steps. On the other hand, if the rolling reduction ratio is greater than 80% and the annealing temperature is higher than 590° C., the gases positively gather to remarkably increase the amount of the voids. Where the rolling reduction ratio is set lower, the creation of the voids is suppressed by employing a lower annealing temperature. A diffusion-annealing period is preferably not shorter than 2 minutes, more preferably not shorter than 3 minutes. The upper limit of the annealing period is not particularly defined, but may be not longer than 10 minutes, preferably not longer than 5 minutes in consideration of the productivity.

Figure 2:
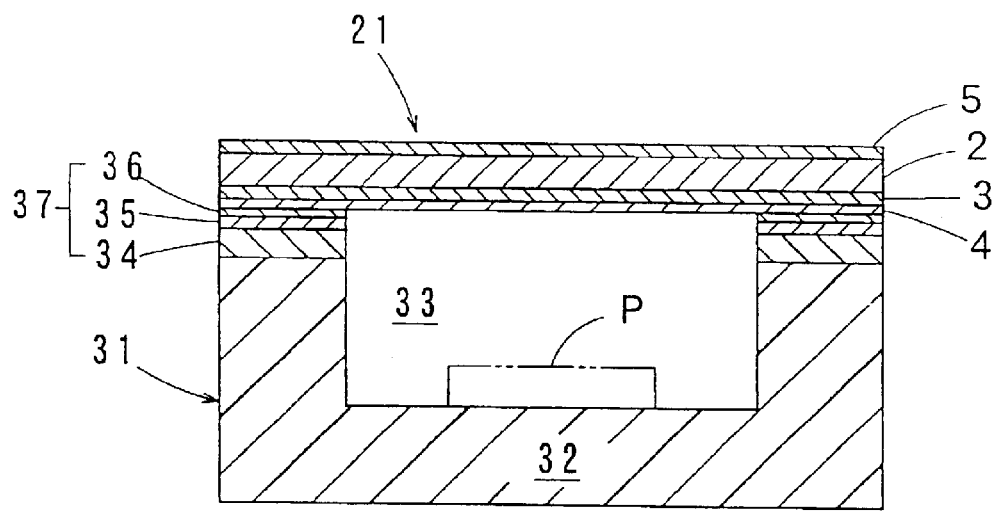
FIG. 2 is a schematic sectional view illustrating the basic construction of an electronic component package according to the embodiment of the present invention.

Next, an embodiment of the electronic component package will be described with reference to FIG. 2. A lid 21 to be employed for sealing a case 31 of the package is produced by stamping the aforesaid lid material 1 into a predetermined size by means of a press. In FIG. 2, components of the lid 21 are the same as those of the lid material 1 and, hence, denoted by the same reference characters, and no explanation will be given thereto.

The package comprises the case 31 having an opening through which a housing space (cavity) 33 for housing an electronic component P opens in an upper surface thereof, and the lid 21 fuse-bonded to a portion of the case 31 around the opening by brazing. The case 31 includes an insulative case body 32 composed of a ceramic material such as alumina or silicon nitride. The housing space 33 opens in the upper surface of the case body 32. A fuse-bonding acceleration layer 37 for accelerating the fuse-bonding of the brazing material is integrally formed on a portion of the case body 32 around the opening. The fuse-bonding acceleration layer 37 includes a metallization layer 34 of a high melting point metal such as tungsten (W) or molybdenum (Mo) sintered integrally with the case body 32, a nickel layer 35 and, as required, a gold layer 36 provided on the metallization layer 34.

When the lid 21 is to be fuse-bonded to the portion of the case 31 around the opening, the lid 21 is placed on the case 31 to close the opening of the case 31 with the brazing material layer 4 contacting the portion of the case 31 around the opening. Then, the brazing material layer 4 is fused in a vacuum or in an inert gas and the lid 21 is fuse-bonded to the portion of the case 31 around the opening. The fusion of the brazing material layer 4 is preferably achieved by local heating by way of the seam welding or the electron beam welding. Since the silver brazing alloy constituting the brazing material layer 4 has a relatively high melting point, the characteristics of the electronic component P housed in the case 31 may be deteriorated by entirely heating the combination of the lid 21 and the case 31 housing the electronic component P in an oven for fusing the brazing material layer 4. Therefore, such a heating method should be avoided. In the seam welding, a pair of electrode rollers are rolled along two opposed edges of the lid 21 for electrical energization of the lid, whereby Joule heat is locally generated in portions of the base layer 2 in contact with the rollers. The Joule heat is conducted to the brazing material layer 4 through the intermediate metal layer 3 to fuse the brazing material layer 4. The lid 21 is brazed to the case 31 with the fused brazing material.

In the lid 21 of the electronic component package, the intermediate metal layer 3 is provided between the base layer 2 and the brazing material layer 4 with the intervention of virtually no void. Therefore, when the lid 21 is brazed to the case 31, the intermediate metal layer 3 facilitates the quick fusion of the brazing material layer 4. Even if the base layer 2 of the lid 21 is thermally deformed, the intermediate metal layer 3 is plastically deformed to accommodate the deformation of the base layer 2. Therefore, an unacceptable thermal stress is not exerted on the case 31, so that the breakage of the case body 32 can be prevented. Accordingly, the case 31 is excellent in hermeticity, so that the service life of the electronic component P housed in the case 31 can be improved.

The present invention will hereinafter be described more specifically by way of examples thereof. However, it should be understood that the scope of the present invention is limited to neither the embodiments described above nor the following examples.

EXAMPLES

Samples of lid materials of four-layer structure as shown in FIG. 1 were each produced in the following manner. A base sheet of a Fe—29 mass % Ni—17 mass % Co alloy having a width of 20 mm and a thickness of 1100 $\mu$m was prepared as a material for a base layer 2, and a nickel sheet of pure Ni having a width of 20 mm and a thickness of 100 $\mu$m was prepared as a material for a nickel-based metal layer 5. Further, a copper sheet of oxygen-free copper (Cu: 99.95 mass %, O: 0.0006 mass %) having a width of 20 mm and a thickness of 600 $\mu$m was prepared as a material for an intermediate metal layer 3. The nickel sheet was stacked on one surface of the base sheet, and the copper sheet was stacked on the other surface of the base sheet. Then, the resulting stack was cold-rolled at a rolling reduction ratio of 60% to provide a copper layer laminate in which the respective adjacent material sheets are press-bonded. The copper layer laminate was diffusion-annealed in an annealing oven at 1000° C. for 3 minutes.

A brazing material sheet of an 85 mass % Ag—Cu (melting point: 780° C.) having a width of 20 mm and a thickness of 75 $\mu$m was stacked as a material for a brazing material layer 4 on the copper layer of the resulting copper layer bonded body. Then, the resulting stack was cold-rolled at a rolling reduction ratio of 44 to 80% as shown in Table 1 to provide a brazing material layer press-bonded body in which the brazing material layer was press-bonded to the copper layer of the copper layer laminate. The brazing material layer press-bonded body was diffusion-annealed at an annealing temperature as shown in Table 1 for about 3 minutes. Thus, a lid material 1 of four-layer structure was provided in which the nickel-based metal layer 5 and the intermediate metal layer 3 were integrally bonded to the opposite surfaces of the base layer 2. That is, the nickel layer and the copper layer were formed as the nickel-based metal layer 5 and the intermediate metal layer 3, respectively, in the examples. The final average thicknesses of the respective layers of the lid materials produced by employing different rolling reduction ratios for the press bonding of the brazing material layer are as follows.

(1) Rolling reduction ratio: 44%
Impossible to press-bond and, hence, no measurement.
(2) Rolling reduction ratio: 50%
Nickel layer: 19 $\mu$m, Base layer: 206 $\mu$m,
Copper layer: 113 $\mu$m, Brazing material layer: 38 $\mu$m
(3) Rolling reduction ratio: 55%
Nickel layer: 17 $\mu$m, Base layer: 186 $\mu$m,
Copper layer: 101 $\mu$m, Brazing material layer: 34 $\mu$m
(4) Rolling reduction ratio: 60%
Nickel layer: 15 $\mu$m, Base layer: 165 $\mu$m,
Copper layer: 90 $\mu$m, Brazing material layer: 30 $\mu$m
(5) Rolling reduction ratio: 70%
Nickel layer: 11 $\mu$m, Base layer: 121 $\mu$m,
Copper layer: 66 $\mu$m, Brazing material layer: 23 $\mu$m
(6) Rolling reduction ratio: 75%
Nickel layer: 9 $\mu$m, Base layer: 103 $\mu$m,
Copper layer: 56 $\mu$m, Brazing material layer: 19 $\mu$m
(7) Rolling reduction ratio: 80%
Nickel layer: 7.5 $\mu$m, Base layer: 83 $\mu$m,
Copper layer: 45 $\mu$m, Brazing material layer: 15 $\mu$m For observation of appearance of the samples, strips each having a size of 2 cm×2 cm were cut out of the respective samples thus produced, and a center portion of the brazing material layer of each of the strips was observed at a magnification of 5× by an optical microscope. With the use of a photograph taken for the observation of the appearance, the total area of blisters occurring due to voids in a visual field having dimensions of 20 mm×20 mm (actual dimensions of 4 mm×4 mm) was measured by means of image analyzing software for determination of the blistered area ratio. A product available under the trade name of Image-Pro (from a maker MEDIA CYVER NETICS) was employed as the image analyzing software.

Further, bonding test strips each having a width of 10 mm and a length of 100 mm were sampled from the respective lid materials. The strips were each bent along a longitudinally middle line thereof by 180 degrees with longitudinally opposite edges thereof being overlapped, and then restored. The bonding property of the brazing material layer was evaluated by observing a bent portion of the strip to check for separation of the brazing material layer. The results of the evaluation are also shown in Table 1. For the evaluation of the bonding property in Table 1, ⊙ denotes that the brazing material layer was not raised from the copper layer and no separation occurred, ○ denotes that the brazing material layer was partly raised but separation did not occur in the entire bent portion, and X denotes that the brazing material layer was entirely raised and separated in the bent portion.

TABLE 1

| Sample No. | Conditions for bonding brazing material layer | | Blistered area ratio % | Bonding property | Remarks |
|---|---|---|---|---|---|
| | Rolling reduction ratio % | Annealing temperature ° C. | | | |
| 1 | 44 | — | — | — | Comparative example |
| 2 | 50 | 350 | Not greater than 0.1 | x | Comparative example |
| 3 | 50 | 380 | Not greater than 0.1 | ○ | Example |
| 4 | 50 | 500 | Not greater than 0.1 | ○ | Example |
| 5 | 50 | 600 | 2.5 | x | Comparative example |
| 6 | 50 | 700 | 21 | x | Comparative example |
| 7 | 55 | 350 | Not greater than 0.1 | x | Comparative example |
| 8 | 55 | 380 | Not greater than 0.1 | ○ | Example |
| 9 | 55 | 500 | Not greater than 0.1 | ○ | Example |
| 10 | 55 | 600 | 1.2 | ○ | Comparative example |
| 11 | 55 | 700 | 25 | x | Comparative example |
| 12 | 60 | 350 | Not greater than 0.1 | x | Comparative example |
| 13 | 60 | 380 | Not greater than 0.1 | ○ | Example |
| 14 | 60 | 400 | Not greater than 0.1 | ○ | Example |
| 15 | 60 | 500 | Not greater than 0.1 | ○ | Example |
| 16 | 60 | 600 | 5.5 | x | Comparative example |
| 17 | 60 | 700 | 32 | x | Comparative example |
| 18 | 70 | 350 | Not greater than 0.1 | x | Comparative example |
| 19 | 70 | 400 | Not greater than 0.1 | ○ | Example |
| 20 | 70 | 500 | Not greater than 0.1 | ⊙ | Example |
| 21 | 70 | 590 | Not greater than 0.1 | ○ | Example |
| 22 | 70 | 650 | 10 | x | Comparative example |
| 23 | 70 | 700 | 39 | x | Comparative example |
| 24 | 75 | 590 | Not greater than 0.1 | ○ | Example |
| 25 | 75 | 650 | 40 | x | Comparative example |
| 26 | 80 | 590 | Not greater than 0.1 | ○ | Example |

As can be understood from Table 1, the samples according to the examples were virtually free from voids with a blistered area ratio of not greater than 0.10%. These samples were excellent in the bonding property of the brazing material layer, and presented no problem associated with the stamping of the lid material into a very small size lid. In contrast, as for Sample No. 1 produced by employing a rolling reduction ratio of 44%, the press-bonding of the brazing material layer was impossible. As for Sample Nos. 2, 7, 12 and 18 each produced by employing a rolling reduction ratio of not smaller than 50% for the bonding of the brazing material layer but a lower annealing temperature (350° C.), the bonding of the brazing material layer was insufficient. As for Sample Nos. 5, 6, 10, 11, 16, 17, 22, 23 and 25 each produced by employing a proper rolling reduction ratio but an excessively high diffusion-annealing temperature of not lower than 600° C., the blistered area ratio was remarkably increased to reduce the bonding strength, and the separation of the brazing material layer caused by the 180-degree bending was observed in the entire bent portion.

Figure 3:
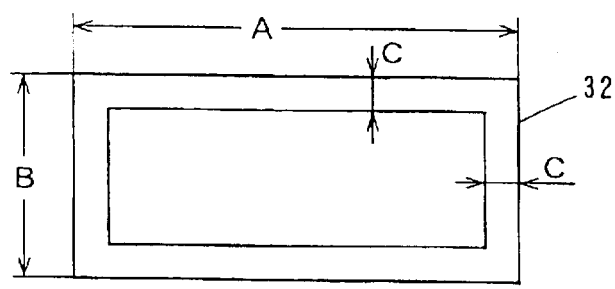
FIG. 3 is a plan view of a case of an electronic component package according to an example.

Subsequently, as shown in FIG. 2, a case 31 was prepared, which included a case body 32 of alumina having an electronic component housing space having an open top, and a fuse-bonding acceleration layer 37 provided on the periphery of the case body and including a tungsten metallization layer 34, a nickel layer 35 and a gold layer 36. The case 31 was dimensioned so that A=5 mm, B=3 mm and C=0.5 mm as seen in plan in FIG. 3.

On the other hand, the lid materials of Sample Nos. 14 to 16 shown in Table 1 were each cold-rolled to a thickness of 0.1 mm for finish rolling, and then stamped for production of a 4.8 mm×2.8 mm lid 21 capable of covering the upper surface of the case 31. The nickel layer, the base layer, the copper layer and the brazing material layer of the lid material subjected to the finish rolling had average thicknesses of 5 µm, 55 µm, 30 µm and 10 µm, respectively. The lids 21 thus produced were each placed on the case 31 with the brazing material layer 4 thereof contacting the fuse-bonding acceleration layer 37, and fuse-bonded to the case by seam welding in a helium gas environment under the same conditions.

The resulting packages were each put in a vacuum container, which was in turn air-tightly closed. Then, gas was expelled from the vacuum container by means of an ion pump, and checked for the presence or absence of helium at the attained vacuum degree. As a result, no helium was detected in the expelled gas for the packages produced by employing the lid materials of Sample Nos. 14 and 15 according to examples. As for the package produced by employing the lid material of Sample No. 16 according to a comparative example, helium was detected in the expelled gas. Thus, it was confirmed that the packages produced by employing the lid materials according to the examples were free from the breakage of the case bodies and the lids thereof were properly bonded to the cases. The package produced by employing the lid material according to the comparative example was also free from the breakage of the case body. Therefore, the deterioration of the hermeticity was supposedly attributable to insufficient bonding between the lid and the case.

What is claimed:

1. A lid material for a lid of an electronic component package, the lid being adapted to be fuse-bonded to a portion of a case around an opening through which an electronic component housing space defined in the case opens in a surface of the case, the lid material comprising:

a base layer composed of a low thermal expansion metal;

an intermediate metal layer provided on one surface of the base layer and composed of a low proof stress metal having a proof stress of not greater than about 110N/mm$^2$; and a brazing material layer provided on the intermediate metal layer and composed of a silver brazing alloy mainly comprising silver;

wherein the intermediate metal layer and the brazing material layer are press- and diffusion-bonded to each other, and the brazing material layer has a blistered area ratio of not greater than about 0.5% as observed on an outer surface of the brazing material layer.

2. A lid for an electronic component package, which is produced from a lid material as recited in claim 1 so as to be dimensioned to cover the opening of the case.

3. An electronic component package comprising:

a case having an opening through which an electronic component housing space defined therein opens in a surface thereof; and a lid fuse-bonded to a portion of the case around the opening to cover the opening;

the lid being produced from a lid material as recited in claim 1.

4. A lid material for a lid of an electronic component package, the lid being adapted to be fuse-bonded to a portion of a case around an opening through which an electronic component housing space defined in the case opens in a surface of the case, the lid material comprising:

a base layer composed of a low thermal expansion metal;

an intermediate metal layer provided on one surface of the base layer and composed of a low proof stress metal having a proof stress of not greater than about 110 N/mm$^2$; and a brazing material layer provided on the intermediate metal layer and composed of a silver brazing alloy mainly comprising silver;

wherein the intermediate metal layer and the brazing material layer are press- and diffusion-bonded to each other, and the brazing material layer has a blistered area ratio of not greater than about 0.5% as observed on an outer surface of the brazing material layer; and wherein the low proof stress metal is a pure copper having a copper content of not smaller than about 99.9 mass %.

5. A lid material as set forth in claim 4, wherein the pure copper is an oxygen-free copper having an oxygen content of not greater than about 0.05 mass %.

6. A lid material as set forth in claim 4, wherein the intermediate metal layer has an average thickness of not smaller than about 10 μm and not greater than about 200 μm.

7. A lid material as set forth in claim 4, further comprising a nickel-based metal layer bonded to the other surface of the base layer and composed of a nickel-based metal consisting of pure nickel or a nickel alloy mainly comprising nickel.

8. A lid for an electronic component package, which is produced from a lid material as recited in claim 4 so as to be dimensioned to cover the opening of the case.

9. An electronic component package comprising:

a case having an opening through which an electronic component housing space defined therein opens in a surface thereof; and a lid fused-bonded to a portion of the case around the opening to cover the opening;

the lid being produced from a lid material as recited in claim 4.

10. An electronic component package including a lid made from the lid material as recited in claim 4.

11. An electronic component package as set forth in claim 10, wherein the pure copper of the lid material is an oxygen-free copper having an oxygen content of not greater than about 0.05 mass %.

12. An electronic component package as set forth in claim 10, wherein the intermediate metal layer of the lid material has an average thickness of not smaller than about 10 μm and not greater than about 200 μm.

13. An electronic component package as set forth in claim 10, wherein the lid material further includes a nickel-based metal layer bonded to the other surface of the base layer and composed of a nickel-based metal consisting of pure nickel or a nickel alloy mainly comprising nickel.

14. A method of producing a lid material for a lid of an electronic component package, the lid being adapted to be fuse-bonded to a portion of a case around an opening through which an electronic component housing space defined in the case opens in a surface of the case, the method comprising the steps of:

preparing an intermediate metal layer laminate which comprises a base layer composed of a low thermal expansion metal and an intermediate metal layer provided on one surface of the base layer and composed of a low proof stress metal having a proof stress of not greater than about 110 N/mm$^2$;

press-bonding a brazing material layer of a silver brazing alloy mainly comprising silver onto the intermediate metal layer of the intermediate metal layer laminate to provide a brazing material layer press-bonded body; and diffusion-annealing the brazing material layer press-bonded body for diffusion-bonding the brazing material layer to the intermediate metal layer to provide the lid material;

wherein a rolling reduction ratio for the press-bonding is not smaller than about 50% and not greater than about 80% in the press-bonding step, and an annealing temperature is not lower than about 380° C. and not higher than about 590° C. in the annealing step.

15. A production method as set forth in claim 14, wherein the low proof stress metal is a pure copper having a copper content of not smaller than about 99.9 mass %.

16. A production method as set forth in claim 15, wherein the pure copper is an oxygen-free copper having an oxygen content of not greater than about 0.05 mass %.

17. A production method as set forth in claim 14, wherein the intermediate metal layer of the brazing material layer press-bonded body has an average thickness of not smaller than about 10 μm and not greater than about 200 μm.

18. A production method as set forth in claim 14, wherein the intermediate metal layer laminate further comprises a nickel-based metal layer provided on the other surface of the base layer and composed of a nickel-based metal consisting of pure nickel or a nickel alloy mainly comprising nickel.

* * * * *